(12) United States Patent
Takahashi et al.

(10) Patent No.: US 12,512,814 B2
(45) Date of Patent: Dec. 30, 2025

(54) ELECTRODE STRUCTURE OF CRYSTAL UNIT, CRYSTAL UNIT, AND CRYSTAL OSCILLATOR

(71) Applicant: MAXIS-01 CORPORATION, Tokyo (JP)

(72) Inventors: Noboru Takahashi, Tokyo (JP); Ryo Kobayashi, Tokyo (JP); Yukihiro Okamoto, Hyogo (JP)

(73) Assignee: MAXIS-01 Corporation, Tokyo (JP)

( * ) Notice: Subject to any disclaimer, the term of this patent is extended or adjusted under 35 U.S.C. 154(b) by 778 days.

(21) Appl. No.: 17/906,267

(22) PCT Filed: Dec. 28, 2020

(86) PCT No.: PCT/JP2020/049056
§ 371 (c)(1),
(2) Date: Sep. 14, 2022

(87) PCT Pub. No.: WO2021/186839
PCT Pub. Date: Sep. 23, 2021

(65) Prior Publication Data
US 2023/0130678 A1 Apr. 27, 2023

(30) Foreign Application Priority Data

Mar. 18, 2020 (JP) ................................. 2020-047607

(51) Int. Cl.
*H03H 9/13* (2006.01)
*H03B 5/30* (2006.01)
*H03H 9/17* (2006.01)

(52) U.S. Cl.
CPC ................. *H03H 9/13* (2013.01); *H03B 5/30* (2013.01); *H03H 9/176* (2013.01)

(58) Field of Classification Search
CPC ...... H03H 9/13; H03H 9/0547; H03H 9/1021; H03H 9/131; H03B 5/30
See application file for complete search history.

(56) References Cited

U.S. PATENT DOCUMENTS

| 6,125,088 A * | 9/2000 | Ogasawara | G11B 7/13927 369/112.02 |
| 6,191,524 B1 * | 2/2001 | Sasaki | H03H 9/0595 310/371 |
| 6,628,582 B2 * | 9/2003 | Furukawa | G11B 7/13925 369/112.02 |
| 7,020,051 B2 * | 3/2006 | Kim | G11B 7/1353 |

(Continued)

FOREIGN PATENT DOCUMENTS

| JP | 2003-273682 A | 9/2003 |
| JP | 2005027089 A | 1/2005 |

(Continued)

*Primary Examiner* — Pedro J Cuevas
(74) *Attorney, Agent, or Firm* — WCF IP

(57) ABSTRACT

The present invention is able to reduce a CI value without requiring precise processing of a crystal blank.

An electrode structure of a crystal unit (1) according to the present invention includes driven electrodes (21, 22) arranged at least at a center on main surfaces (11, 12) of a crystal blank (10). The driven electrodes (21, 22) have a structure in which vibration energy of thickness shear vibration of the crystal blank (10) is concentrated in a central region of the crystal blank (10).

19 Claims, 6 Drawing Sheets

(56) References Cited

U.S. PATENT DOCUMENTS

| | | | | |
|---|---|---|---|---|
| 7,042,136 | B2* | 5/2006 | Kita | G11B 5/4873 |
| | | | | 310/366 |
| 7,764,329 | B2* | 7/2010 | Lee | G02F 1/13624 |
| | | | | 349/39 |
| 7,869,331 | B2* | 1/2011 | Mori | G11B 7/0908 |
| | | | | 369/112.15 |
| 8,098,353 | B2* | 1/2012 | Kim | G02F 1/133707 |
| | | | | 349/139 |
| 8,179,344 | B2* | 5/2012 | Hsieh | G09G 3/3648 |
| | | | | 349/39 |
| 8,199,266 | B2* | 6/2012 | Su | G02F 1/13624 |
| | | | | 349/39 |
| 8,791,766 | B2* | 7/2014 | Ishii | H10N 30/87 |
| | | | | 310/368 |
| 8,970,316 | B2* | 3/2015 | Ishii | H03H 9/0552 |
| | | | | 310/368 |
| 9,030,078 | B2* | 5/2015 | Il | H03H 9/1021 |
| | | | | 310/333 |
| 9,225,314 | B2* | 12/2015 | Ishii | H03H 9/1021 |
| 9,231,183 | B2* | 1/2016 | Naito | H03H 9/02062 |
| 9,431,995 | B2* | 8/2016 | Yamashita | H03H 9/19 |
| 9,496,480 | B2* | 11/2016 | Naito | H10N 30/101 |
| 9,590,588 | B2 | 3/2017 | Kobayashi et al. | |
| 9,716,484 | B2* | 7/2017 | Yamashita | H03H 9/02157 |
| 9,837,982 | B2* | 12/2017 | Il | H03H 9/0509 |
| 9,985,604 | B2* | 5/2018 | Yamamoto | H03H 9/1021 |
| 10,135,420 | B2* | 11/2018 | Ibaragi | H03H 9/1021 |
| 10,162,232 | B2* | 12/2018 | Miyamoto | G02F 1/13394 |
| 10,361,675 | B2* | 7/2019 | Yamamoto | H03H 3/02 |
| 10,411,673 | B2* | 9/2019 | Yamamoto | H03H 9/10 |
| 10,418,964 | B2* | 9/2019 | Yamamoto | H03H 9/0519 |
| 10,425,057 | B2* | 9/2019 | Yamamoto | H03H 9/02157 |
| 10,516,382 | B2* | 12/2019 | Lee | H03H 9/17 |
| 10,601,393 | B2* | 3/2020 | Kojo | H03H 9/02 |
| 10,629,799 | B2* | 4/2020 | Yumura | H10N 30/87 |
| 11,108,378 | B2* | 8/2021 | Ikeda | H03H 9/19 |
| 11,121,697 | B2* | 9/2021 | Kawai | H03H 9/02023 |
| 11,233,499 | B2* | 1/2022 | Ikeda | H03H 9/13 |
| 12,160,221 | B2* | 12/2024 | Matsumura | H03H 9/1021 |
| 2002/0101798 | A1* | 8/2002 | Kim | G11B 7/13927 |
| 2005/0219186 | A1* | 10/2005 | Kamada | G02F 1/134336 |
| | | | | 345/90 |
| 2012/0057118 | A1* | 3/2012 | Morishita | G02F 1/134363 |
| | | | | 349/141 |
| 2012/0235762 | A1* | 9/2012 | Il | H03H 9/0542 |
| | | | | 310/365 |
| 2012/0242193 | A1 | 9/2012 | Shimao et al. | |
| 2013/0043959 | A1* | 2/2013 | Ishii | H03H 9/0542 |
| | | | | 331/158 |
| 2013/0043960 | A1* | 2/2013 | Ishii | H03H 9/1021 |
| | | | | 29/25.35 |
| 2013/0241359 | A1* | 9/2013 | Naito | H03H 9/02062 |
| | | | | 310/348 |
| 2013/0328452 | A1 | 12/2013 | Fujihara et al. | |
| 2014/0300252 | A1* | 10/2014 | Ishii | H03H 9/132 |
| | | | | 310/365 |
| 2015/0015119 | A1* | 1/2015 | Takahashi | H03H 9/17 |
| | | | | 29/25.35 |
| 2015/0054386 | A1* | 2/2015 | Ishii | H10N 30/2042 |
| | | | | 310/367 |
| 2016/0011248 | A1 | 1/2016 | Kishi et al. | |
| 2016/0226444 | A1* | 8/2016 | Yamashita | H03H 9/177 |
| 2017/0302249 | A1 | 10/2017 | Obara et al. | |
| 2018/0069521 | A1 | 3/2018 | Sai | |
| 2018/0076792 | A1* | 3/2018 | Asai | H03H 9/02023 |
| 2018/0083598 | A1* | 3/2018 | Yamamoto | H03H 9/0552 |
| 2018/0097504 | A1* | 4/2018 | Yamamoto | H03H 9/02023 |
| 2018/0123560 | A1* | 5/2018 | Kawai | H03H 9/19 |
| 2018/0205364 | A1 | 7/2018 | Kaga et al. | |
| 2018/0212584 | A1* | 7/2018 | Yamamoto | H03H 9/0552 |
| 2018/0212585 | A1* | 7/2018 | Yamamoto | H03H 3/04 |
| 2018/0241371 | A1 | 8/2018 | Kubota et al. | |
| 2018/0323768 | A1* | 11/2018 | Ikeda | H03H 9/1035 |
| 2019/0067549 | A1 | 2/2019 | Fujihara et al. | |
| 2019/0245512 | A1* | 8/2019 | Ibaragi | H03H 9/02086 |
| 2020/0014359 | A1* | 1/2020 | Ikeda | H03H 9/10 |
| 2020/0014366 | A1* | 1/2020 | Ikeda | H03H 9/13 |
| 2020/0186116 | A1* | 6/2020 | Yamamoto | H03H 9/132 |

FOREIGN PATENT DOCUMENTS

| | | | | |
|---|---|---|---|---|
| JP | 2005-159717 A | | 6/2005 | |
| JP | 2005-318477 A | | 11/2005 | |
| JP | 2008-005333 A | | 1/2008 | |
| JP | 2008-047982 A | | 2/2008 | |
| JP | 2013-255052 A | | 12/2013 | |
| JP | 2014-027505 A | | 2/2014 | |
| JP | 5589167 B2 | * | 9/2014 | H03H 3/02 |
| JP | WO2013151048 A1 | * | 12/2015 | H03H 9/19 |
| JP | 2016-019225 A | | 2/2016 | |
| JP | 2017-152994 A | | 8/2017 | |
| JP | 2017-192032 A | | 10/2017 | |
| JP | 2018-042121 A | | 3/2018 | |
| JP | 2018-117198 A | | 7/2018 | |
| JP | WO2018047876 A1 | * | 6/2019 | H03H 9/0509 |
| JP | 6537029 B2 | * | 7/2019 | H03H 3/02 |
| TW | 201240338 A | | 10/2012 | |
| WO | WO-2016140301 A1 | * | 9/2016 | H01L 23/08 |
| WO | WO-2020195830 A1 | * | 10/2020 | H03H 3/04 |

* cited by examiner

ELECTRODE STRUCTURE OF CRYSTAL UNIT, CRYSTAL UNIT, AND CRYSTAL OSCILLATOR

TECHNICAL FIELD

The present invention relates to an electrode structure of a crystal unit, the crystal unit, and a crystal oscillator.

BACKGROUND ART

In recent years, various devices equipped with a crystal unit have become smaller, lighter and more multifunctional, and a smaller crystal unit with high performance is required as a crystal unit to be used for these devices. As a crystal unit becomes smaller, a crystal blank used for the crystal unit is also smaller and a driven electrode arranged on the crystal blank also decreases in area. As a result, an equivalent series resistor (i.e., a crystal impedance (CI)) value of the crystal unit (crystal blank) is larger. Further, main vibration is more susceptible to a sub vibration such as inharmonic vibration. Therefore, when the crystal blank is mounted in a housing, conditions of adhesive (e.g., a position and an amount of adhesive application) for suppressing influence of the sub vibration become strict, and a problem such as decrease in a yield at the time of mass production is more likely to occur.

Techniques of manufacturing a small crystal unit with high performance by precisely processing a shape of a side surface of a crystal blank have been proposed (for example, see PTL 1).

The technique disclosed in PTL 1 adjusts each axial direction of a crystal blank and, in wet etching, two crystal planes are formed on a side surface in a –X axial direction of the crystal blank and six (or four) crystal planes are formed on a side surface in a +X axial direction of the crystal blank. As a result, a sub vibration is suppressed and a CI value of the crystal blank is reduced. However, the technique requires precise control in the order of several μm for mask pattern formation in a photolithography process and for an etching amount of a thickness of the crystal blank and many other processes in order to form a desired crystal plane. Thus, in the technique, it is extremely difficult to maintain high productivity without reducing a yield between each process.

CITATION LIST

Patent Literature

[PTL 1] JP2014-027505A

SUMMARY OF INVENTION

Technical Problem

An object of the present invention is to provide an electrode structure of a crystal unit, the crystal unit, and a crystal oscillator that are capable of reducing a CI value without requiring precise processing for a crystal blank.

Solution to Problem

An electrode structure of a crystal unit, the crystal unit, and a crystal oscillator according to the present invention include a driven electrode arranged at least at a center on a main surface of a crystal blank, and the driven electrode has a structure for concentrating vibration energy of thickness shear vibration of the crystal blank in a central region of the crystal blank.

Advantageous Effects of Invention

The present invention is able to reduce a CI value without requiring precise processing of a crystal blank.

BRIEF DESCRIPTION OF DRAWINGS

FIG. 6 is a schematic cross-sectional view of another embodiment of the crystal unit according to the present invention.

FIG. 7 is a schematic cross-sectional view of still another embodiment of the crystal unit according to the present invention.

DESCRIPTION OF EMBODIMENTS

Figure 1A:
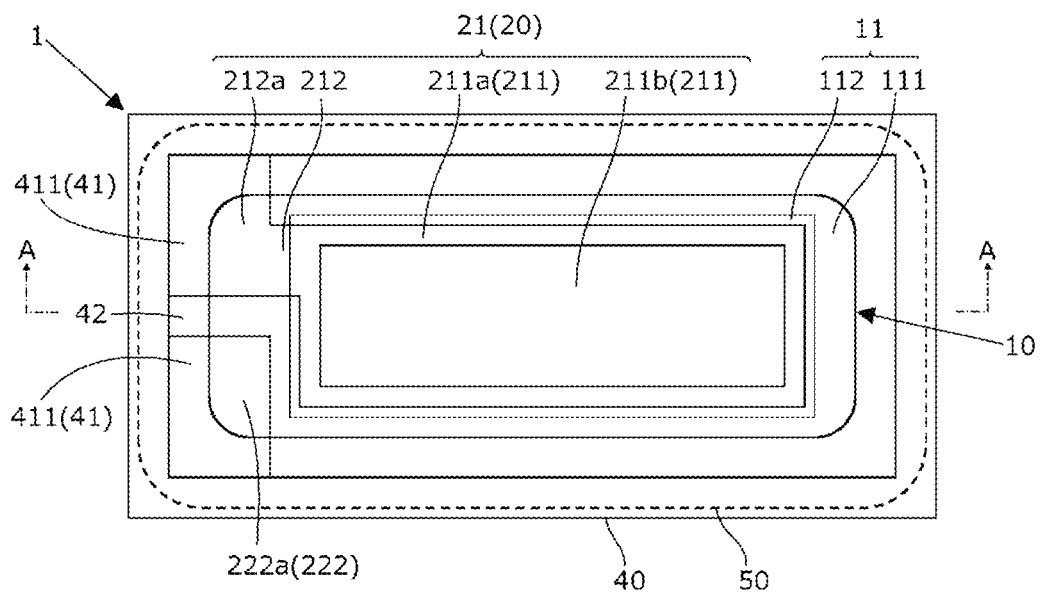
FIG. 1A is a schematic plan view of an embodiment of a crystal unit according to the present invention.

Embodiments of an electrode structure (hereinafter referred to as "present structure") of a crystal unit, the crystal unit, and a crystal oscillator according to the present invention are described below with reference to the drawings. In the drawings, the same members are indicated with the same reference signs and a repetitive description is omitted.

Crystal Unit

First, an embodiment of a crystal unit and the present structure according to the present invention is described.

Figure 1B:
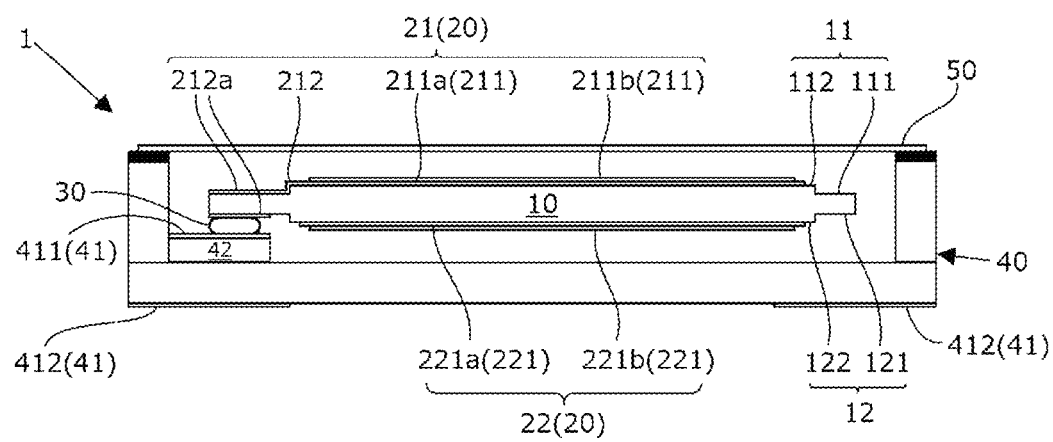
FIG. 1B is a schematic cross-sectional view taken along a line AA of the crystal unit in FIG. 1A.

FIG. 1A is a schematic plan view of the embodiment of the crystal unit according to the present invention and FIG. 1B is a schematic cross-sectional view taken along a line AA of the crystal unit in FIG. 1A. For convenience of description, a cap 50 to be described later is illustrated as a dashed line in FIG. 1A.

A crystal unit 1 is mounted on a predetermined oscillation circuit and thus generates a signal having a predetermined oscillation frequency, based on an applied voltage (hereinafter referred to as "applied voltage"). The crystal unit 1 is, for example, a surface mounted type (SMD type) crystal unit. The crystal unit 1 includes a crystal blank 10, an electrode 20, a conductive adhesive 30, a housing 40, and the cap 50.

The crystal blank 10 is driven at a predetermined frequency, based on the applied voltage. The crystal blank 10 is, for example, an AT-cut crystal blank. The AT cut is a well-known technique and the description thereof is omitted. The crystal blank 10 is a rectangular shape in a plan view and a plate shape in a lateral view. The crystal blank 10 includes a first main surface 11 (a surface on the upper side in FIG. 1B) and a second main surface 12 (a surface on the lower side of the page in FIG. 1B). In the present embodiment, a longitudinal direction of the crystal blank 10 is along an X axial direction of a crystal, and a lateral direction of the crystal blank 10 is along a Z' axial (an axis inclined by 35.15 degrees from a Z axis of the crystal) direction of the crystal. A direction perpendicular to both main surfaces 11 and 12 of the crystal blank 10 is along a Y' axial (an axis inclined by 35.15 degrees from a Y axis of the crystal) direction of the crystal.

The first main surface 11 includes an outer edge portion 111 and a central portion 112 that is a region inside the outer edge portion 111 in the plan view. The central portion 112 protrudes above the outer edge portion 111 in a rectangular shape. The second main surface 12 includes an outer edge portion 121 and a central portion 122 that is a region inside the outer edge portion 121 in the plan view. The central portion 122 protrudes below the outer edge portion 121 in a rectangular shape. In other words, the crystal blank 10 has a mesa-shaped structure in which the central portions 112 and 122 of both main surfaces 11 and 12 are thicker than the outer edge portions 111 and 121.

The electrode 20 applies a predetermined voltage to the crystal blank 10. The structure of the electrode 20 (i.e., the present structure) is described later.

The conductive adhesive 30 electrically connects each of a pair of connection electrodes 212a and 222a described later to an electrode pad 412 of the housing 40 described later. As a result, the crystal blank 10 is mechanically fixed inside the housing 40.

The housing 40 accommodates the crystal blank 10 having the present structure described later. The housing 40 is a sintered body in which ceramics such as alumina are laminated. The housing 40 is a known housing (package) of a crystal unit. The housing 40 has a rectangular shape in the plan view and a box shape having an opening in an upper portion. The housing 40 includes an electrode 41 and a stepped portion 42.

The electrode 41 includes an external electrode 411 arranged on a lower surface of the bottom of the housing 40 and a pair of electrode pads 412 arranged on an upper surface of the bottom (stepped portion 42) of the housing 40. The stepped portion 42 is arranged on the upper surface of the bottom on one short side of the housing 40.

The cap 50 hermetically seals the opening in the upper portion of the housing 40. The cap 50 is made of metal, for example.

Electrode Structure of Crystal Unit

Next, the present structure is described.

The electrode 20 includes a first main surface electrode 21 arranged on the first main surface 11 and a second main surface electrode 22 arranged on the second main surface 12.

The first main surface electrode 21 includes a first driven electrode 211 and a first extraction electrode 212. The first driven electrode 211 applies an applied voltage to the crystal blank 10. The first driven electrode 211 includes a first electrode portion 211a and a second electrode portion 211b.

The first electrode portion 211a is arranged on the central portion 112 of the first main surface 11. In the plan view, the first electrode portion 211a has an area smaller than an area of the central portion 112 and is arranged inside the central portion 112. The second electrode portion 211b is arranged on the first electrode portion 211a in a laminated manner. In the plan view, the second electrode portion 211b has an area smaller than the area of the first electrode portion 211a and is arranged inside the first electrode portion 211a. That is, the first driven electrode 211 has a two-layer structure constituted of two electrode portions 211a and 211b that are laminated so that the area is sequentially reduced.

An angle between an end surface (side surface) of the first electrode portion 211a and the central portion 112 of the first main surface 11 is, for example, 30 to 90 degrees. An angle between an end surface (side surface) of the second electrode portion 211b and the first electrode portion 211a is, for example, 30 to 90 degrees. Herein, the first electrode portion 211a is substantially parallel to the central portion 112 of the first main surface 11. In other words, the angle between the end surface of each of the plurality of electrode portions 211a and 211b and a virtual plane parallel to the first main surface 11 is 30 to 90 degrees. Herein, the angle of the end surface is measured, for example, physically by a probe or optically using transmitted light.

Herein, an outer edge portion (a region of the first electrode portion 211a where the second electrode portion 211b is not laminated) of the first driven electrode 211 constitutes an electrode outer edge portion in the present invention. In contrast, in the plan view, a region (a region where the first electrode portion 211a and the second electrode portion 211b are laminated) inside the electrode outer edge portion constitutes an electrode central portion in the present invention. The electrode outer edge portion is constituted of the first electrode portion 211a and the electrode central portion is constituted of the first electrode portion 211a and the second electrode portion 211b. That is, the electrode central portion is thicker than the electrode outer edge portion.

The first extraction electrode 212 transmits an applied voltage to the first driven electrode 211. The first extraction electrode 212 is connected to the first driven electrode 211 and is arranged on the first main surface 11 so as to be drawn out from the central portion 112 to the outer edge portion 111 of one short side of the crystal blank 10. A part of the first extraction electrode 212 that is drawn out to (arranged on) the outer edge portion 111 constitutes a connection electrode 212a connected to the conductive adhesive 30. The first extraction electrode 212 is formed integrally with the first electrode portion 211a.

The first extraction electrode 212 and the first electrode portion 211a include an underlying metal film arranged on the first main surface 11 and a metal film arranged on the underlying metal film. The second electrode portion 211b includes an underlying metal film arranged on the first electrode portion 211a and a metal film arranged on the underlying metal film. In the present embodiment, the underlying metal film is a Cr film and the metal film is an Au film.

The second main surface electrode 22 includes a second driven electrode 221 and a second extraction electrode 222. The second driven electrode 221 applies an applied voltage to the crystal blank 10. The second driven electrode 221 includes a first electrode portion 221a and a second electrode portion 221b.

The first electrode portion 221a is arranged on the central portion 122 of the second main surface 12. In the plan view, the first electrode portion 221a has an area smaller than an area of the central portion 122 and is arranged inside the central portion 122. The second electrode portion 221b is arranged on the first electrode portion 221a in a laminated manner. In the plan view, the second electrode portion 221b has an area smaller than the area of the first electrode portion 221a and is arranged inside the first electrode portion 221a. That is, the second driven electrode 221 has a two-layer structure constituted of two electrode portions 221a and 221b that are laminated so that the area is sequentially reduced. In the present embodiment, the second driven electrode 221 has a symmetrical structure to the first driven electrode 211 across the crystal blank 10.

An angle between an end surface (side surface) of the first electrode portion 221a and the central portion 122 of the second main surface 12 is, for example, 30 to 90 degrees. An angle between an end surface (side surface) of the second electrode portion 221b and the first electrode portion 221a is, for example, 30 to 90 degrees. Herein, the first electrode portion 221a is substantially parallel to the central portion 122 of the second main surface 12. In other words, the angle between the end surface of each of the plurality of electrode portions 221a and 221b and a virtual plane parallel to the second main surface 12 is 30 to 90 degrees.

Herein, an outer edge portion (a region of the first electrode portion 221a where the second electrode portion 221b is not laminated) of the second driven electrode 221 constitutes the electrode outer edge portion in the present invention. In contrast, in the plan view, a region (a region where the first electrode portion 221a and the second electrode portion 221b are laminated) inside the electrode outer edge portion constitutes the electrode central portion in the present invention. The electrode outer edge portion is constituted of the first electrode portion 221a and the electrode central portion is constituted of the first electrode portion 221a and the second electrode portion 221b. In other words, the electrode central portion is thicker than the electrode outer edge portion.

The second extraction electrode 222 transmits an applied voltage to the second driven electrode 221. The second extraction electrode 222 is connected to the second driven electrode 221 and is arranged on the second main surface 12 so as to be drawn out from the central portion 122 to the outer edge portion 121 of one short side of the crystal blank 10. A part of the second extraction electrode 222 that is drawn out to (arranged on) the outer edge portion 121 constitutes a connection electrode 222a connected to the conductive adhesive 30. The second extraction electrode 222 is formed integrally with the first electrode portion 221a.

The second extraction electrode 222 and the first electrode portion 221a include an underlying metal film arranged on the second main surface 12 and a metal film arranged on the underlying metal film. The second electrode portion 221b includes an underlying metal film arranged on the first electrode portion 221a and a metal film arranged on the underlying metal film. In the present embodiment, the underlying metal film is the Cr film and the metal film is the Au film.

Each of the first main surface electrode 21 and the second main surface electrode 22 is formed by performing a photolithography process, for example. That is, for example, two layers of the underlying metal film and the metal film are formed on the crystal blank 10 with vapor deposition or the like, and then, in a state where the second electrode portions 211b and 221b are masked with a resist, the metal film and the underlying metal film on the upper layer side are removed by etching. Then, in a state where the first electrode portions 211a and 221a, the first extraction electrode 212, and the second extraction electrode 222 are masked, the metal film and the underlying metal film on the lower layer side are removed by etching.

Note that, after the first electrode portion, the first extraction electrode, and the second extraction electrode are formed, the underlying metal film and the metal film on the upper layer side may be vapor-deposited in a state where portions other than the second electrode portion are masked with the resist. In this case, the underlying metal film and the metal film other than the second electrode portion are removed together with the resist.

Further, after the first electrode portion, the first extraction electrode, and the second extraction electrode are formed, the underlying metal film and the metal film on the upper layer side may be vapor-deposited in a state where the portions other than the second electrode portion are masked with a metal mask or the like.

Figure 2:
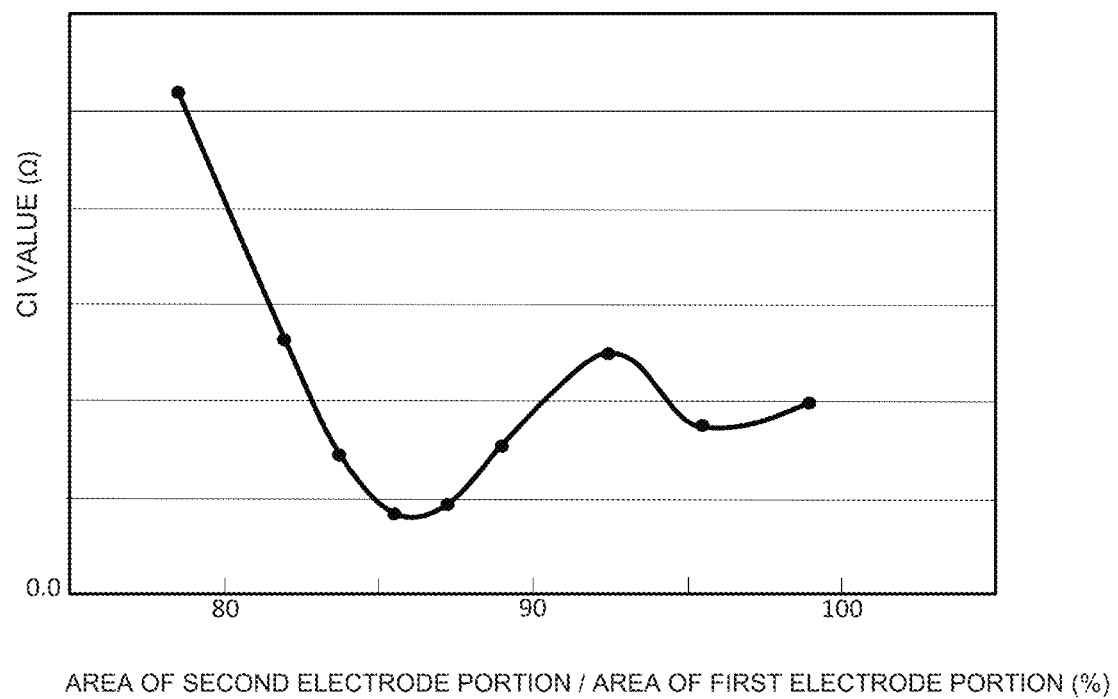
FIG. 2 is a graph illustrating an example of a relationship between an area ratio of an electrode included in the crystal unit in FIG. 1 and a CI value.

FIG. 2 is a graph illustrating an example of a relationship between an electrode area ratio and a CI value when the area of the first electrode portion 211a is fixed and the area of the second electrode portion 211b is changed.

The axis of abscissa in the figure indicates an area ratio of the second electrode portion 211b to the area of the first electrode portion 211a (the area of the second electrode portion 211b divided by the area of the first electrode portion 211a). The axis of ordinate in the figure indicates the CI value. As illustrated in FIG. 2, the CI value decreases between approximately 83% and 95% of the area ratio, and particularly greatly decreases between approximately 83% and 90% of the area ratio.

Figure 3A:
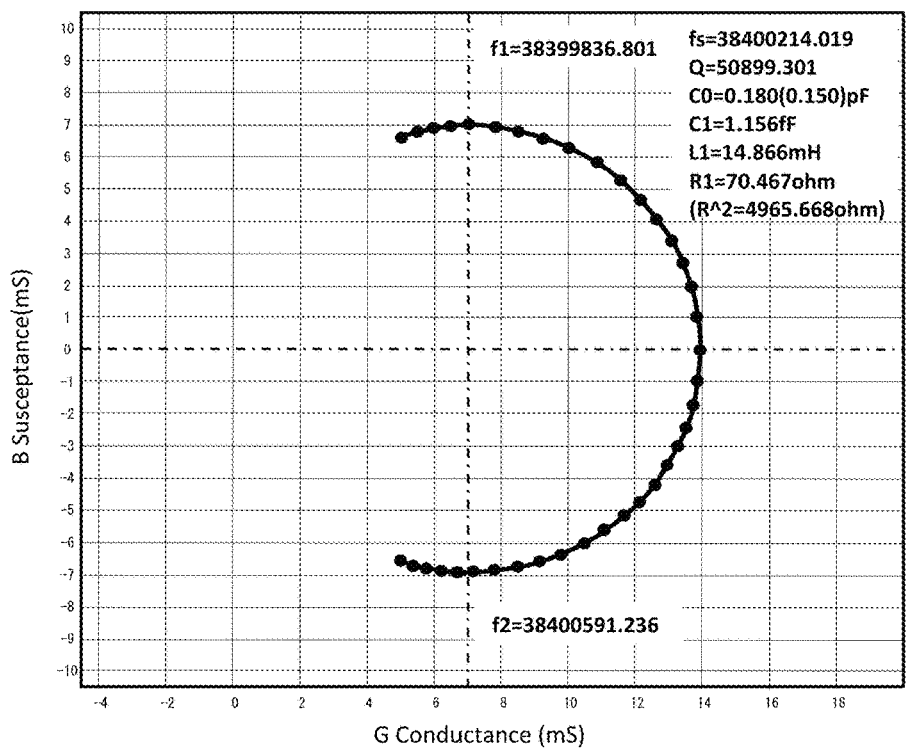
FIG. 3A is a graph illustrating a simulation result of an admittance circle diagram when a driven electrode has a one-layer structure in a crystal blank included in the crystal unit in FIG. 1.
Figure 3B:
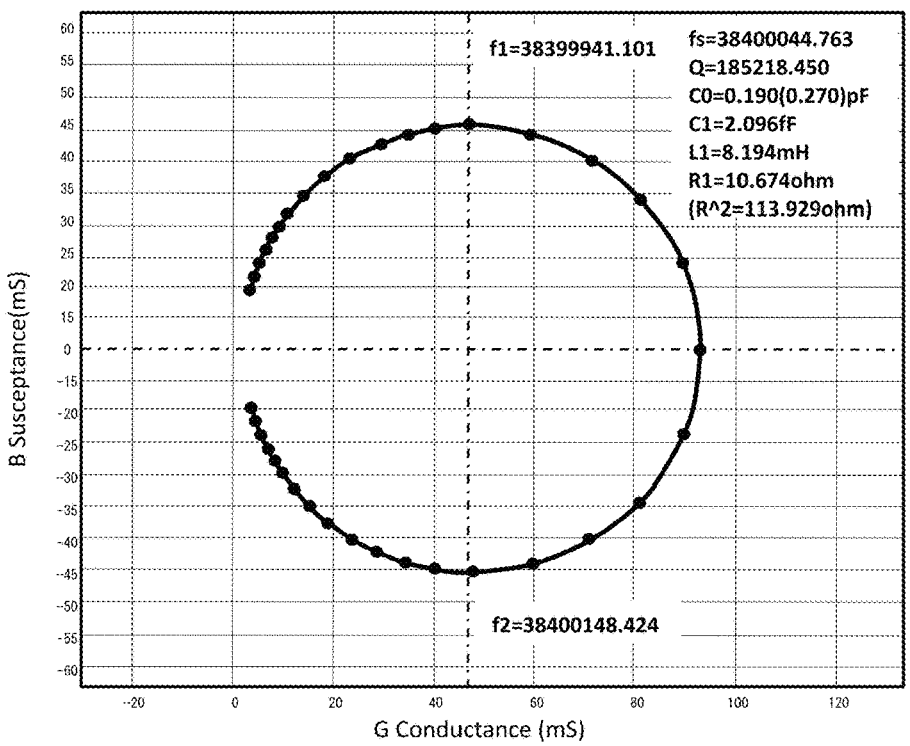
FIG. 3B is a graph illustrating a simulation result of the admittance circle diagram when the driven electrode has a two-layer structure in the crystal blank.

FIG. 3A is a graph illustrating a simulation result of an admittance circular diagram when a driven electrode has a one-layer structure in a crystal blank equivalent to the crystal blank 10 of the present embodiment, and FIG. 3B is a graph illustrating a simulation result of the admittance circular diagram in the present embodiment (the driven electrode has a two-layer structure).

As illustrated in FIG. 3, the CI value (approximately 10 Ω) when the driven electrode has the two-layer structure is significantly reduced as compared to the CI value (approximately 70 Ω) when the driven electrode has the one-layer structure.

Figure 4:
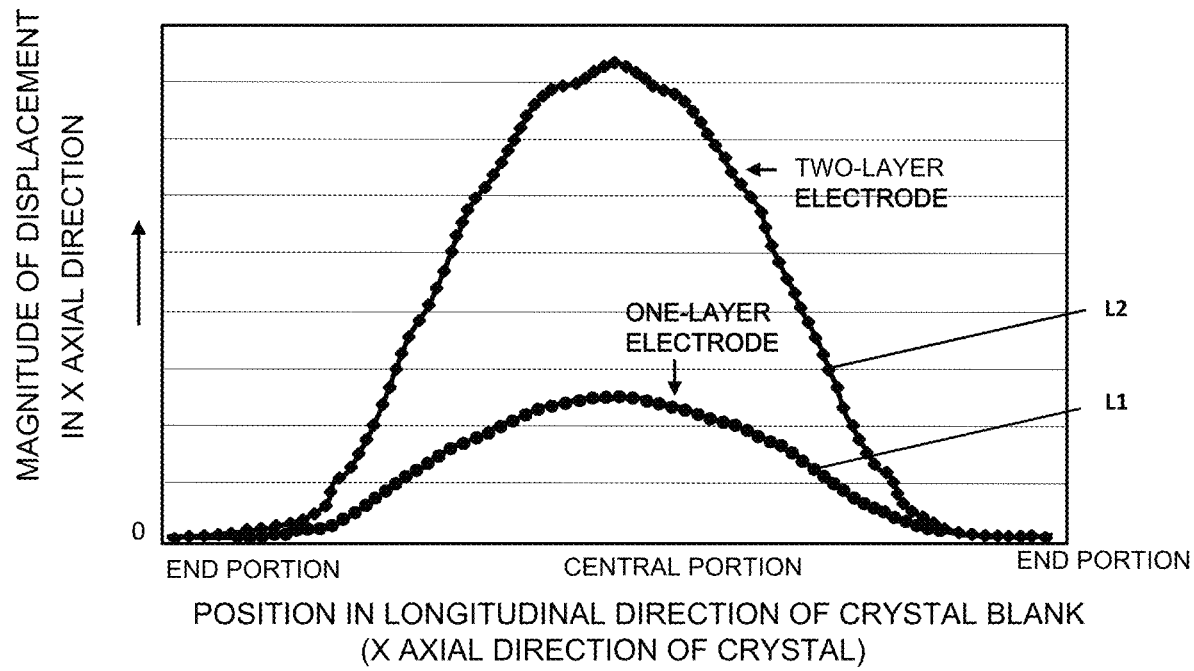
FIG. 4 is a graph illustrating magnitude of displacement of the crystal blank in a longitudinal direction of the crystal blank when voltage applied to the crystal blank included in the crystal unit in FIG. 1 is constant.

FIG. 4 is a graph illustrating magnitude of displacement of the crystal blank 10 in a longitudinal direction of the crystal blank 10 when voltage applied to the crystal blank 10 is constant.

The axis of abscissa in the figure indicates a position in the longitudinal direction of the crystal blank 10 (the X axial direction in an axial direction of the crystal). The axis of ordinate in the figure indicates the magnitude of the displacement in the X axial direction. "L1" in the figure indicates the displacement when the driven electrode has the one-layer structure and "L2" in the figure indicates the displacement when the driven electrode has the two-layer structure. Herein, the magnitude of the displacement of the axis of ordinate in the figure may be indicated as an admittance Y. A relationship of "Y=1/Z" is established between the admittance Y and an impedance Z. That is, when the displacement X is increased, the impedance Z (i.e., CI value) is reduced.

As illustrated in FIG. 4, the displacement when the driven electrode has the two-layer structure is approximately two to three times larger than the displacement when the driven electrode has the one-layer structure. In particular, the difference in displacement in both structures becomes larger toward the central portion from the end portion in the X axial direction. This indicates that vibration energy of main vibration is concentrated in the central region (the region between the central portions 112 and 122 of both main surfaces 11 and 12) of the crystal blank 10 and the vibration energy is confined in the central region.

Thus, since each of the first driven electrode 211 and the second driven electrode 221 has the two-layer structure in which the area decreases as being laminated on the upper side, the vibration energy of the main vibration is concentrated in the central region of the crystal blank 10 and the vibration energy is confined in the central region. As a result, an equivalent series resistor (i.e., crystal impedance (CI)) value of the crystal blank 10 is reduced.

Crystal Oscillator

Next, an embodiment of a crystal oscillator according to the present invention is described. In the embodiment described below, descriptions of the members common to the embodiments described above are omitted.

Figure 5:
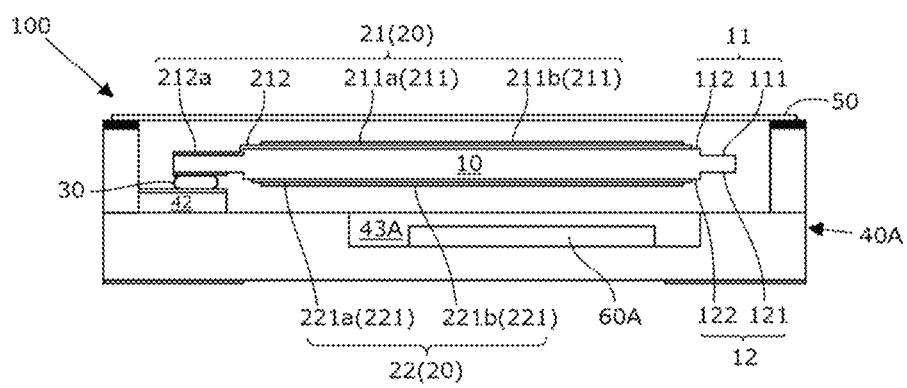
FIG. 5 is a schematic cross-sectional view of an embodiment of a crystal oscillator according to the present invention.

FIG. 5 is a schematic cross-sectional view of the embodiment of the crystal oscillator according to the present invention.

A crystal oscillator 100 is, for example, a temperature-compensated crystal oscillator (TCXO). The crystal oscillator 100 is, for example, a SMD type crystal oscillator. The crystal oscillator 100 includes the crystal blank 10, the electrodes 20, the conductive adhesives 30, the cap 50, a housing 40A, and a circuit 60A.

The housing 40A accommodates the crystal blank 10 and the circuit 60A. The housing 40A is a sintered body in which ceramics such as alumina are laminated. The housing 40A is a known housing (package) of a crystal oscillator. The housing 40A has a rectangular shape in a plan view and a box shape having an opening at the top. The housing 40A includes an electrode (not illustrated), the stepped portion 42, and a circuit accommodating portion 43A.

The circuit accommodating portion 43A accommodates the circuit 60A. The circuit accommodating portion 43A is arranged in the central portion of the bottom of the housing 40A.

The circuit 60A controls an oscillation frequency of the crystal blank 10 (crystal unit 1). The circuit 60A is, for example, a known temperature compensating circuit.

Conclusion

According to the embodiments described above, the present structure has the two-layer structure in which the area of each of the first driven electrode 211 and the second driven electrode 221 decreases as being laminated on the upper side. Therefore, the present structure concentrates the vibration energy of the main vibration in the central region of the crystal blank 10 and confines the vibration energy in the central region. As a result, the CI value of the crystal blank 10 is reduced. Thus, the present structure, and the crystal unit 1 and the crystal oscillator 100 that have the present structure, are able to reduce the CI value without requiring precise processing of the crystal blank 10.

Further, since the CI value is reduced, an absolute value of dispersion of the CI value is reduced. That is, for example, an average CI value increased by 50% for the average CI value of 100 Ω is 150 Ω, whereas the average CI value increased by 50% for the average CI value of 10 Ω is 15 Ω. Further, for example, the CI value increased by 50 Ω for the CI value of 100 Ω is 150 Ω, whereas the CI value increased by 50 Ω for the CI value of 10 Ω is 60 Ω. As described above, even when the CI value varies, the CI value easily falls within standards. As a result, a productivity (yield) of each of the crystal unit 1 and the crystal oscillator 100 that have the present structure is improved. In this case, an etching amount of the outer edge portions 111 and 121 of the crystal blank 10 is reduced by reducing the CI value according to the present invention. As a result, a productivity (yield) of the crystal blank 10 is improved.

Further, according to the embodiments described above, the vibration energy of the main vibration is confined in the central region of the crystal blank 10, and thus influence of coupling vibration on the end portion of the crystal blank 10, that is, the outer edge portion 111 of the crystal blank 10 where the connection electrodes 212a and 222a are arranged is suppressed. Therefore, influence of the conductive adhesive 30 on the main vibration is suppressed. As a result, the productivity (yield) of each of the crystal unit 1 and the crystal oscillator 100 that have the present structure is improved.

Furthermore, according to the embodiments described above, the crystal oscillator 100 using the crystal unit 1 having the present structure enables operation on low drive level when incorporated in an oscillation circuit, which contributes to stabilization of oscillation.

Others

Note that the crystal blank in the present invention may be driven by the thickness shear vibration as the main vibration and a cut of the crystal blank in the present invention is not limited to the AT cut. That is, for example, the cut of the crystal blank in the present invention may be a BT cut, an SC cut, or an IT cut.

Further, the crystal blank in the present invention is not limited to a mesa shape. That is, for example, the crystal blank in the present invention may have any structure of a flat-plate shape, a bevel shape, a mesa shape, an inverted-mesa shape, a convex shape or a plano convex shape. In this case, since the CI value according to the present invention is reduced, a bevel amount is reduced in the bevel shape, and an etching amount of a concave portion in the central portion of the crystal blank is reduced in the inverted-mesa shape. As a result, the productivity (yield) of the crystal blank is improved.

Figure 6A:
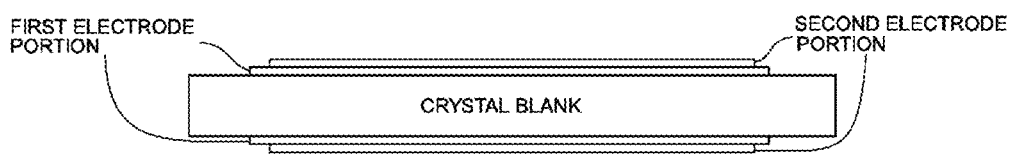
FIG. 6A illustrates a flat-plate-shaped crystal blank.
Figure 6B:
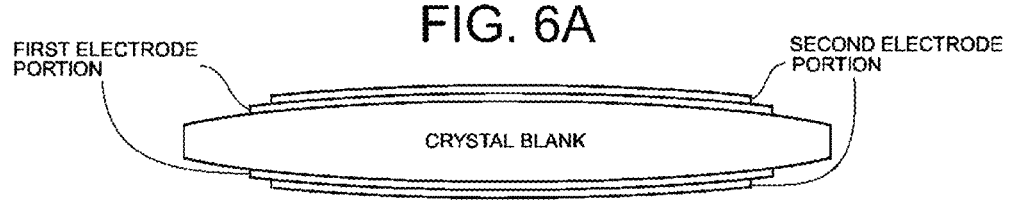
FIG. 6B illustrates a bevel-shaped crystal blank.
Figure 6C:
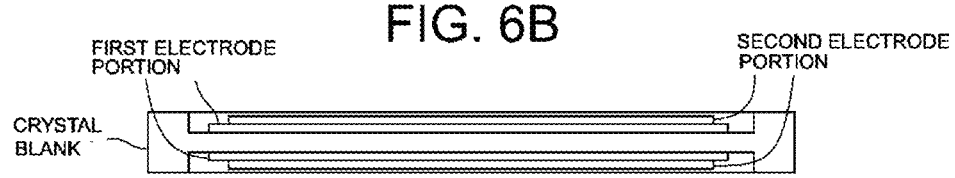
FIG. 6C illustrates an inverted-mesa-shaped crystal blank.

FIGS. 6A to 6C are schematic cross-sectional views of another embodiment of the crystal unit according to the present invention. The figures illustrate only a cross section of each of the crystal blank and the electrode for convenience of description. FIG. 6A illustrates a flat-plate-shaped crystal blank, FIG. 6B illustrates a bevel-shaped crystal blank, and FIG. 6C illustrates an inverted-mesa-shaped crystal blank.

Further, a length of a long side (side along the X axial direction) of each crystal blank in the present invention is preferably 2 mm or less. According to this configuration, the present structure reduces the CI value as compared to other structures (e.g., a shape of the crystal blank, a thickness and a position of the electrode, and the like). In other words, the present structure may reduce the CI value more than other structures as the crystal blank is smaller.

Furthermore, the crystal blank in the present invention may be collectively formed by a photolithography process, or may be individually formed by a method such as polishing, cutting, surface etching, or the like.

Furthermore, the crystal blank in the present invention may be driven in a vibration mode of a fundamental wave mode, or may be driven in the vibration mode of a high-order (third-order, fifth-order) overtone mode.

Furthermore, each of the first driven electrode and the second driven electrode in the present invention may be constituted of a plurality of electrode portions arranged on both main surfaces and laminated so that the area is sequentially reduced, and is not limited to the two-layer structure. In other words, for example, each of the first driven electrode and the second driven electrode in the present invention may be arranged on the second electrode portion in a laminated manner and a third electrode portion having an area smaller than the area of the second electrode portion may be included. Further, for example, the number of layers of the first driven electrode may be different from the number of layers of the second driven electrode.

Furthermore, the second driven electrode in the present invention may have an asymmetrical structure to the first driven electrode across the crystal blank. In other words, for example, the second driven electrode in the present invention may be arranged so as to be shifted in the X axial direction and/or the Z' axial direction with respect to the first driven electrode in a plan view.

Furthermore, the first electrode portion and the second electrode portion in the present invention may be integrally constituted. In other words, for example, the first electrode portion and the second electrode portion in the present invention may be constituted of a one-layer underlying metal film and a one-layer metal film. In this case, the electrode outer edge portion may be formed, for example, by removing an outer edge portion of the one-layer metal film.

Furthermore, the thickness of the first electrode portion and the thickness of the second electrode portion in the present invention may be the same or different. Herein, the thickness of each electrode portion is calculated, for example, based on a frequency of the crystal blank before and after the vapor-deposition. Further, the thickness of each electrode portion may be measured, for example, physically by a probe, or optically using transmitted light.

Furthermore, the underlying metal film in the present invention may be any metal film having affinity for each of the crystal blank and the metal film, and is not limited to the Cr film. In other words, for example, the underlying metal film in the present invention may include at least one metal of Cr, Ni or W.

Furthermore, the metal film in the present invention may be a metal film capable of supplying an applied voltage that enables a crystal to be driven, and is not limited to the Au film. In other words, for example, the metal film in the present invention may include at least one metal of Au, Ag, Cu, Al, W, Ni, or Mg.

Furthermore, each of the first driven electrode and the second driven electrode in the present invention may be constituted of the electrode outer edge portion and the electrode central portion that is a region inside the electrode outer edge portion in a plan view and includes a metal having a mass larger than a mass of a metal constituting the electrode outer edge portion. In other words, for example, the electrode outer edge portion may be constituted of an Ag or Al film and the electrode central portion may be constituted of the Au film. In this configuration, the mass of the electrode central portion in one axial direction (e.g., X axial direction) may be larger than the mass of the electrode outer edge portion. Thus, the thickness of the electrode central portion may be the same as the thickness of the electrode outer edge portion, or may be smaller than the thickness of the electrode outer edge portion. Further, for example, a metal film (e.g., Au film) having a large mass may be covered with a metal film (e.g., Al film) having a small mass at the electrode central portion. Similarly to the two-layer structure described above, these configurations concentrate and confine the vibration energy of the main vibration in the central region of the crystal blank 10 due to mass effect of the electrode central portion.

Figure 7A:
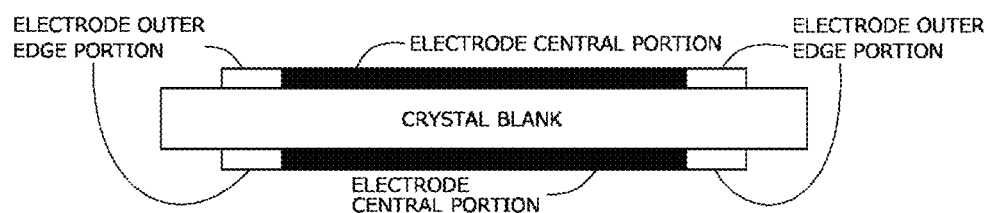
FIG. 7A illustrates a configuration in which an electrode outer edge portion and an electrode central portion have the same thickness.
Figure 7B:
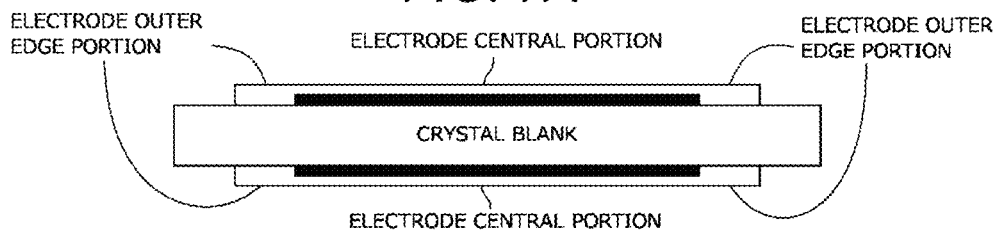
FIG. 7B illustrates a configuration in which a metal film having a large mass is covered with a metal film having a small mass at the electrode central portion.
Figure 7C:
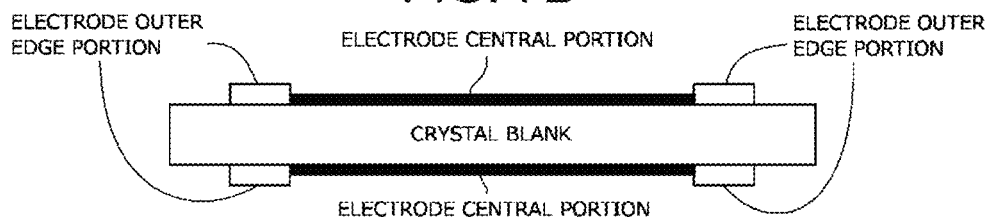
FIG. 7C illustrates a configuration in which the thickness of the electrode outer edge portion is larger than the thickness of the electrode central portion.

FIGS. 7A to 7C are schematic cross-sectional views of still another embodiment of the crystal unit according to the present invention. The figures illustrate only a cross section of each of the crystal blank and the electrode for convenience of description. The black electrodes in the figures are constituted of a metal having a mass larger than a mass of the white electrodes. FIG. 7A illustrates a configuration in which the thickness of each of the electrode outer edge portion and the electrode central portion is the same, FIG. 7B illustrates a configuration in which a metal film having a large mass is covered with a metal film having a small mass at the electrode central portion, and FIG. 7C illustrates a configuration in which the thickness of the electrode outer edge portion is larger than the thickness of the electrode central portion.

Furthermore, an end surface of each electrode portion in the present invention may be a curved surface.

Furthermore, in a plan view, one of the four sides of the second electrode in the present invention may overlap with one of the four sides of the first electrode.

Furthermore, the crystal oscillator according to the present invention is not limited to the temperature compensated crystal oscillator. In other words, for example, the crystal oscillator according to the present invention may be a voltage-controlled crystal oscillator (VCXO), an oven-controlled crystal oscillator (OCXO), or a simple packaged crystal oscillator (SPXO).

REFERENCE SIGNS LIST

1 Crystal unit
10 Crystal blank
11 First main surface
12 Second main surface
21 First main surface electrode
211 First driven electrode
211a First electrode portion
211b Second electrode portion
22 Second main surface electrode
221 Second driven electrode
221a First electrode portion
221b Second electrode portion
100 Crystal oscillator

The invention claimed is:

1. An electrode structure of a crystal unit comprising:
a driven electrode arranged at least at a center on a main surface of a crystal blank having a rectangular shape in a plan view, wherein,
the driven electrode includes:
an electrode outer edge portion arranged on the main surface and constituted of a first electrode portion having a rectangular shape in the plan view; and an electrode central portion that is a region inside the electrode outer edge portion in the plan view, constituted of a part of the first electrode portion and a second electrode portion arranged on the part of the first electrode portion in a laminated manner, and having a rectangular shape in the plan view, the first electrode portion is constituted of
a metal film functioning as the driven electrode, and
an underlying metal film functioning as an underlayer arranged between the metal film and the crystal blank, the second electrode portion is constituted of a metal film functioning as the driven electrode, a first area of the driven electrode is defined by an outer edge of the electrode outer edge portion and is smaller than an area of the main surface, a second area of the electrode central portion is smaller than the first area, a mass per unit area of the electrode central portion is larger than a mass per unit area of the electrode outer edge portion, a CI curve representing a relationship between an area ratio of the second area to the first area and a CI value of the crystal blank includes a first bottom point and a second bottom point where the CI value is a relative minimum value, the area ratio corresponding to the second bottom point is smaller than the area ratio corresponding to the first bottom point, and the first area and the second area are set based on the area ratio corresponding to the second bottom point.

2. The electrode structure of the crystal unit according to claim 1, wherein the CI value at the second bottom point is less than or equal to the CI value at the first bottom point.

3. The electrode structure of the crystal unit according to claim 2, wherein the CI value at the second bottom point is less than the CI value at the first bottom point.

4. The electrode structure of the crystal unit according to claim 1, wherein
the first bottom point exists within a range where the area ratio is 90% or more and less than 100%, and
the second bottom point exists within a range where the area ratio is 80% or more and less than 90%.

5. The electrode structure of the crystal unit according to claim 1, wherein an angle between an end surface of each of the first electrode portion and the second electrode portion and a virtual plane parallel to the main surface is 30 to 90 degrees.

6. The electrode structure of the crystal unit according to claim 5, wherein each of the metal film of the first electrode portion and the metal film of the second electrode portion is constituted of at least one metal of Au, Ag, Cu, Al, W, Ni, or Mg.

7. The electrode structure of the crystal unit according to claim 6, wherein the metal film constituting the second electrode portion is constituted of a metal identical to the metal film constituting the first electrode portion.

8. The electrode structure of the crystal unit according to claim 6, wherein the underlying metal film includes at least one metal of Cr, Ni, or W.

9. The electrode structure of the crystal unit according to claim 1, wherein the electrode central portion includes a metal having a mass larger than a mass of a metal constituting the electrode outer edge portion.

10. The electrode structure of the crystal unit according to claim 9, wherein the electrode outer edge portion has a thickness equal to the electrode central portion.

11. The electrode structure of the crystal unit according to claim 9, wherein the thickness of the electrode outer edge portion is larger than the thickness of the electrode central portion.

12. A crystal unit comprising:
a crystal blank; and
a driven electrode arranged at least at a center on a main surface of the crystal blank, wherein
the driven electrode includes the electrode structure according to claim 1.

13. The crystal unit according to claim 12, wherein the crystal blank is driven by thickness shear vibration as main vibration.

14. The crystal unit according to claim 12, wherein
the crystal blank includes a first main surface and a second main surface that is a surface opposite to the first main surface,
the driven electrode includes a first driven electrode arranged on the first main surface and a second driven electrode arranged on the second main surface, and
the first driven electrode has a symmetrical structure to the second driven electrode across the crystal blank.

15. The crystal unit according to claim 12, wherein
the crystal blank includes a first main surface and a second main surface that is a surface opposite to the first main surface,
the driven electrode includes a first driven electrode arranged on the first main surface and a second driven electrode arranged on the second main surface, and
the first driven electrode has an asymmetrical structure to the second driven electrode across the crystal blank.

16. The crystal unit according to claim 12, wherein the crystal blank has a substantially rectangular shape with a long side of 2 mm or less in the plan view.

17. The crystal unit according to claim 12, wherein the crystal blank is driven in any vibration mode of a fundamental wave mode, a third overtone mode, or a fifth overtone mode.

18. The crystal unit according to claim 12, wherein the crystal blank has any structure of a flat-plate shape, a bevel shape, a mesa shape, an inverted-mesa shape, a convex shape, or a plano convex shape.

19. A crystal oscillator comprising:
a crystal unit; and
a circuit configured to control a vibration frequency of the crystal unit, wherein
the crystal unit is the crystal unit according to claim 12.

* * * * *